(12) United States Patent
Zhang

(10) Patent No.: US 12,132,479 B2
(45) Date of Patent: Oct. 29, 2024

(54) IMPEDANCE CALIBRATION CIRCUIT, IMPEDANCE CALIBRATION METHOD, AND MEMORY

(71) Applicant: CHANGXIN MEMORY TECHNOLOGIES, INC., Hefei (CN)

(72) Inventor: Zhiqiang Zhang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/952,850

(22) Filed: Sep. 26, 2022

(65) Prior Publication Data
US 2023/0015113 A1  Jan. 19, 2023

Related U.S. Application Data

(63) Continuation of application No. PCT/CN2022/103676, filed on Jul. 4, 2022.

(30) Foreign Application Priority Data

Jun. 22, 2022 (CN) .......................... 202210714132.5

(51) Int. Cl.
H03K 19/00 (2006.01)
G11C 7/10 (2006.01)

(52) U.S. Cl.
CPC ....... *H03K 19/0005* (2013.01); *G11C 7/1048* (2013.01)

(58) Field of Classification Search
CPC .............. H03K 19/0005; G11C 7/1048; G11C 29/022; G11C 29/028; G11C 29/12005;
(Continued)

(56) References Cited

U.S. PATENT DOCUMENTS 10,747,245 B1   8/2020  He
2008/0198666 A1  8/2008  Nygren
(Continued)

FOREIGN PATENT DOCUMENTS

CN   112908398 A   6/2021
JP   2009130927 A  6/2009
(Continued)

OTHER PUBLICATIONS

KR office action in application No. 10-2022-7031287, mailed on Aug. 6, 2024.
(Continued)

*Primary Examiner* — Jung Kim
(74) *Attorney, Agent, or Firm* — Syncoda LLC; Feng Ma

(57) ABSTRACT

An impedance calibration circuit, an impedance calibration method, and a memory are provided. The impedance calibration circuit includes a parameter module, an initial value generation module, and a calibration module. The parameter module is configured to perform environment detection processing and output an environment parameter signal; the initial value generation module is configured to receive the environment parameter signal, and output an initial calibration value based on the environment parameter signal when the calibration instruction signal is received; and the calibration module is configured to receive the initial calibration value, and perform impedance calibration processing based on the initial calibration value when the calibration instruction signal is received.

17 Claims, 7 Drawing Sheets

(58) Field of Classification Search
CPC ... G11C 11/4093; G11C 7/04; G11C 11/4076; G11C 2207/2254
See application file for complete search history.

(56) References Cited

U.S. PATENT DOCUMENTS

| | | |
|---|---|---|
| 2009/0003090 A1 | 1/2009 | Kim et al. |
| 2010/0194204 A1 | 8/2010 | Kaiwa |
| 2011/0102073 A1 | 5/2011 | Riho |
| 2012/0002697 A1 | 1/2012 | Cho |
| 2013/0214812 A1 | 8/2013 | Koo |
| 2015/0091611 A1 | 4/2015 | Jeong |
| 2015/0117122 A1 | 4/2015 | Lee et al. |
| 2015/0269985 A1 | 9/2015 | Kaiwa et al. |
| 2016/0277026 A1 | 9/2016 | Mai |
| 2017/0085270 A1 | 3/2017 | Suzuki et al. |
| 2018/0167055 A1 | 6/2018 | Gans |
| 2021/0149423 A1 | 5/2021 | He et al. |
| 2022/0165321 A1 | 5/2022 | Seo et al. |

FOREIGN PATENT DOCUMENTS

| | | | |
|---|---|---|---|
| JP | 2011182378 A | 9/2011 | |
| JP | 2013051464 A * | 3/2013 | ......... H03K 19/0175 |
| JP | 2015216513 A | 12/2015 | |
| KR | 100853466 B1 | 8/2008 | |

OTHER PUBLICATIONS

Extended European Search Report in application No. 22782653, mailed on Jun. 17, 2024.

JP first office action in application No. 2022-562343, mailed on Aug. 13, 2024.

* cited by examiner

IMPEDANCE CALIBRATION CIRCUIT, IMPEDANCE CALIBRATION METHOD, AND MEMORY

CROSS-REFERENCE TO RELATED APPLICATION

This application is a continuation of International Patent Application No. PCT/CN2022/103676, filed on Jul. 4, 2022, which is based upon and claims priority to Chinese Patent Application No. 202210714132.5, filed on Jun. 22, 2022. The disclosures of these application are hereby incorporated by reference in their entireties.

BACKGROUND

During the working process of a Dynamic Random Access Memory (DRAM), output driving or stop processing of signals needs to be realized through some resistors. It should be understood that since the resistance value of the resistor may change with the change of environment parameters (e.g. temperature), the memory needs to calibrate the resistance value of the relevant resistor, which is referred to as ZQ calibration. However, current ZQ calibration takes too much power consumption and system time, so that the performance of the memory is reduced.

SUMMARY

The present disclosure relates to the technical field of semiconductor memories, in particular to an impedance calibration circuit, an impedance calibration method, and a memory.

The technical solutions of the present disclosure are implemented as follows.

According to a first aspect of the present disclosure, there is provided an impedance calibration circuit. The impedance calibration circuit may include a parameter module, an initial value generation module, and a calibration module. Herein, the parameter module may be configured to perform an environment detection processing and output an environment parameter signal. The initial value generation module may be configured to receive the environment parameter signal, and output an initial calibration value based on the environment parameter signal when a calibration instruction signal is received. The calibration module may be configured to receive the initial calibration value, and perform impedance calibration processing based on the initial calibration value when the calibration instruction signal is received.

In a second aspect of the present disclosure, there is provided an impedance calibration method, which is applied to an impedance calibration circuit and may include the following operations.

An environment parameter signal is determined through environment detection processing.

An initial calibration value is determined based on the environment parameter signal.

Impedance calibration processing is performed based on the initial calibration value when a calibration instruction signal is received.

In a third aspect of the present disclosure, there is provided a memory. The memory may include the impedance calibration circuit in the first aspect.

DETAILED DESCRIPTION

Figure 1:
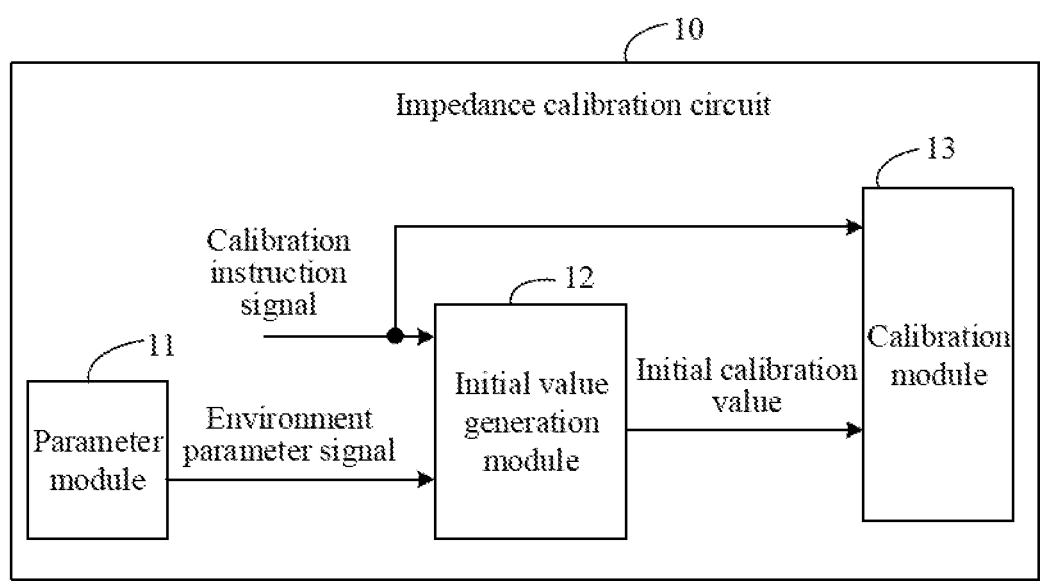
FIG. 1 is a schematic diagram of a structure of an impedance calibration circuit according to an embodiment of the present disclosure.

The technical solutions in the embodiments of the present disclosure will be clearly and completely described in conjunction with the drawings in the embodiments of the present disclosure. It should be understood that that the specific embodiments described herein are only used to illustrate the relevant disclosure, but are not intended to limit the disclosure. In addition, it is to be noted that, for the convenience of description, only the parts related to the relevant disclosure are illustrated in the drawings.

Unless otherwise defined, all technical and scientific terms used herein have the same meaning as commonly understood by those skilled in the art of the present disclosure. The terms used herein are only for the purpose of describing the embodiments of the present disclosure and are not intended to limit the present disclosure.

In the following description, reference is made to "some embodiments" which describe a subset of all possible embodiments, but it should be understood that "some embodiments" may be the same or different subsets of all possible embodiments, and may be combined with each other without conflict.

It is to be noted that the terms "first\second\third" involved in the embodiments of the present disclosure are only used to distinguish similar objects, and do not represent a specific order of the objects. It should be understood that the specific order or sequence of "first\second\third" may be interchangeable under the allowable circumstances, so that the embodiments of the disclosure described herein may be implemented in an order other than those illustrated or described herein.

The following are explanations of professional terms involved in the embodiments of the present disclosure and the corresponding relationship of some nouns.

There are some resistors for output driving and signal stop in the memory. The resistance values of these resistors need to be calibrated to be matched with the actual application scenario. The above impedance calibration process is also called ZQ calibration, and a signal configured to control the resistance value of the resistor is called an impedance calibration code (also known as a ZQ calibration code). That is, during the process of impedance calibration, the resistance value of the resistor is adjusted by adjusting the size of the impedance calibration code until the resistance value of the resistor meets the requirements. At present, when the impedance calibration starts, the impedance calibration code needs to change from a fixed initial value, so that the impedance calibration takes too much power consumption and system time, and the performance of the memory is reduced.

Based on this, the embodiments of the present disclosure provide an impedance calibration circuit. The impedance calibration circuit includes a parameter module, an initial value generation module, and a calibration module. Herein, the parameter module is configured to perform environment detection processing and output an environment parameter signal. The initial value generation module is configured to receive the environment parameter signal, and output an initial calibration value based on the environment parameter signal when a calibration instruction signal is received. The calibration module is configured to receive the initial calibration value, and perform impedance calibration processing based on the initial calibration value when the calibration instruction signal is received. In this way, the impedance calibration processing is performed by using the initial calibration value adapted to the current working environment, which may reduce the power consumption and time of the impedance calibration and improve the performance of the memory.

The embodiments of the present disclosure will be described in detail below with reference to the accompanying drawings.

In an embodiment of the present disclosure, referring to FIG. 1, FIG. 1 illustrates a schematic diagram of a structural composition of an impedance calibration circuit 10 according to an embodiment of the present disclosure. As illustrated in FIG. 1, the impedance calibration circuit 10 may include a parameter module 11, an initial value generation module 12, and a calibration module 13.

The parameter module 11 is configured to perform environment detection processing and output an environment parameter signal.

The initial value generation module 12 is configured to receive the environment parameter signal, and output an initial calibration value based on the environment parameter signal when a calibration instruction signal is received.

The calibration module 13 is configured to receive the initial calibration value, and perform impedance calibration processing based on the initial calibration value when the calibration instruction signal is received.

It is to be noted that, the impedance calibration circuit 10 in the embodiments of the present disclosure is applied to various types of memories, such as a Dynamic Random-Access Memory (DRAM) and a Synchronous Dynamic Random-Access Memory.

The embodiments of the present disclosure provide the impedance calibration circuit 10 with a brand-new architecture. When the impedance calibration starts, the parameter module 11 and the initial value generation module 12 may generate the initial calibration value adapted to the current working environment, so that the initial calibration value is used as the starting point of the entire impedance calibration process, an ideal state may be more quickly adjusted, the power consumption and time of impedance calibration may be reduced, at the same time, a better time margin is provided for the latching of a calibration result, and the performance of the memory is improved.

Here, the calibration instruction signal instructs the start of the impedance calibration process, and is received from the outside (or referred to as a system). The environment parameter signal includes at least one of the following signals: a temperature parameter signal, or a voltage parameter signal.

Figure 2:
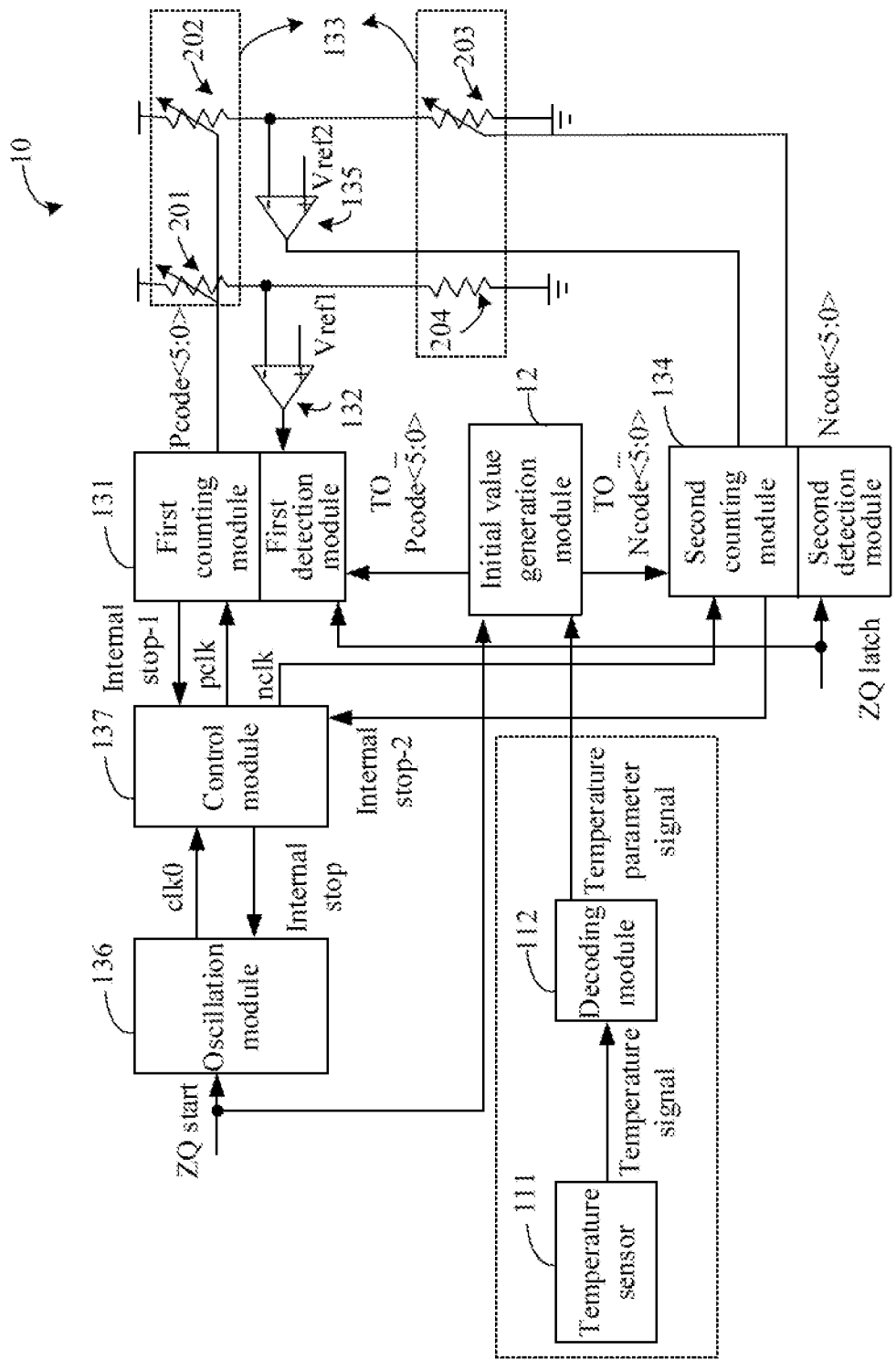
FIG. 2 is a schematic diagram of a detailed structure of an impedance calibration circuit according to an embodiment of the present disclosure.

In a specific embodiment, as illustrated in FIG. 2, the environment parameter signal includes at least a temperature parameter signal. The parameter module 11 includes a temperature sensor 111 and a decoding module 112.

The temperature sensor 111 is configured to perform temperature detection on the environment where the impedance calibration circuit 10 is located to obtain a temperature signal.

The decoding module 112 is configured to receive the temperature signal, perform decoding processing on the temperature signal, and output the temperature parameter signal.

Here, the essence of the temperature parameter signal is an impedance calibration code configured to adjust the resistance impedance. In other words, the decoding module 112 is configured to preliminarily decode the temperature signal into the temperature parameter signal, so as to subsequently determine the initial calibration value.

It is to be noted that, the impedance calibration of the memory involves the calibration of the pull-up impedance (configured to perform output driving on the signal) and the calibration of the pull-down impedance (configured to perform stop processing on the signal). Therefore, in some embodiments, as illustrated in FIG. 2, in some embodiments, the initial calibration value includes a first initial calibration value TO_Pcode<5:0> and a second initial calibration value TO_Ncode<5:0>.

The calibration module 13 is specifically configured to: determine the first initial calibration value TO_Pcode<5:0> as an initial value of a first impedance calibration code Pcode<5:0>, and determine the second initial calibration value TO_Ncode<5:0> as an initial value of a second impedance calibration code Ncode<5:0>; and adjust the first impedance calibration code Pcode<5:0> to realize the calibration of the pull-up impedance; and adjust the second impedance calibration code Ncode<5:0> after the pull-up impedance calibration is completed, to realize the calibration of the pull-down impedance.

It is to be noted that, in FIG. 2, the first impedance calibration code, the second impedance calibration code, the first calibration initial value and the second calibration initial value are all composed of 6 sub-signals, which are represented as <5:0>, but this does not constitute a specific limitation.

That is, in the related art, the respective initial values of the first impedance calibration code and the second impedance calibration code are fixed default values. However, in the embodiment of the present disclosure, the respective initial values of the first impedance calibration code and the second impedance calibration code are determined based on the current working environment, and may be more quickly adjusted to the ideal state, the power consumption and time of impedance calibration may be reduced, at the same time, a better time margin is provided for the latching of the calibration result, and the performance of the memory is improved.

The calibration processing of the pull-up impedance and the calibration processing of the pull-down impedance are described as follows.

In some embodiments, as illustrated in FIG. 2, the calibration module 13 includes a first counting module 131, a first comparator 132, and a resistor module 133. The resistor module 133 includes a first pull-up resistor unit 201 connected with a standard resistor 204.

The resistor module 133 is configured to receive the first impedance calibration code Pcode<5:0>, control the resistance value of the first pull-up resistor unit 201 based on the first impedance calibration code Pcode<5:0>, and output a first voltage signal.

The first comparator 132 is configured to receive the first voltage signal and a first reference signal Vref1, compare the first voltage signal with the first reference signal Vref1, and output a first indication signal.

The first counting module 131 is configured to receive the first indication signal and a first counting clock signal pclk, and perform addition processing on the first impedance calibration code Pcode<5:0> every time a pulse of the first counting clock signal pclk is detected when the first indication signal is in a first level state; and perform subtraction processing on the first impedance calibration code Pcode<5:0> every time a pulse of the first counting clock signal pclk is detected when the first indication signal is in a second level state, so as to achieve the calibration processing of the pull-up impedance.

In this way, the first voltage signal may indicate a difference between the resistance value of the first pull-up resistor unit and the standard resistance value, thereby determining an adjustment direction of the first impedance calibration code Pcode<5:0>, and forming a feedback adjustment loop.

It is to be noted that, the specific relationship (i.e. a positive proportional relationship or a negative proportional relationship) between the first impedance calibration code Pcode<5:0> and the resistance value of the first pull-up resistor unit needs to depend on the actual application scenario. The first level state is different from the second level state, and the specific setting thereof also needs to be determined according to the actual application scenario. In FIG. 2, the positive-phase input terminal of the first comparator 132 receives the first reference signal Vref1, and the negative-phase input terminal of the first comparator 132 receives the first voltage signal, but this does not constitute a specific limitation, and the specific connection relationship also needs to be determined according to the actual application scenario. In other words, as long as a self-consistent circuit adjustment logic is met, the control details of the pull-up impedance may be determined in various flexible ways.

The following provides a feasible control detail: the larger the first impedance calibration code Pcode<5:0>, the smaller the resistance value of the first pull-up resistor unit 201, and the higher the first voltage signal; and the first level state is a high level state, and the second level state is a low level state. At this time, in a case where the resistance value of the first pull-up resistor unit 201 is smaller than the standard resistance, the voltage of the first voltage signal is greater than the first reference voltage, and the first indication signal is in the low level state, so that subtraction processing is performed on the first impedance calibration code Pcode<5:0>, and the resistance value of the first pull-up resistor unit 201 increases. On the contrary, in a case where the resistance value of the first pull-up resistor unit 201 is greater than the standard resistance, the voltage of the first voltage signal is smaller than the first reference voltage, and the first indication signal is in the high level state, so that addition processing is performed on the first impedance calibration code Pcode<5:0>, and the resistance value of the first pull-up resistor unit 201 is reduced. Here, the subtraction processing may be subtraction by one, subtraction by two, etc., and the addition processing may be addition by one, addition by two, etc., depending on the actual application scenario.

Similarly, in some embodiments, as illustrated in FIG. 2, the calibration module 13 further includes a second counting module 134 and a second comparator 135. The resistor module 133 further includes a second pull-up resistor unit 202 and a pull-down resistor unit 203. The resistance value of the second pull-up resistor unit 202 is controlled by the first impedance calibration code Pcode<5:0>, and the second pull-up resistor unit 202 is connected with the pull-down resistor unit 203.

The resistor module 133 is configured to control the resistance value of the pull-down resistor unit 203 based on the second impedance calibration code Ncode<5:0> after the pull-up impedance calibration is completed, and output a second voltage signal. Herein, after the pull-up impedance calibration is completed, the resistance value of the second pull-up resistor unit 202 is calibrated to a standard resistance value by the first impedance calibration code Pcode<5:0>.

The second comparator 135 is configured to receive the second voltage signal and a second reference signal Vref2, compare the second voltage signal with the second reference signal Vref2, and output a second indication signal.

The second counting module 134 is configured to receive the second indication signal and a second counting clock signal nclk, and perform addition processing on the second impedance calibration code Ncode<5:0> every time a pulse of the second counting clock signal nclk is detected when the second indication signal is in a third level state; and perform subtraction processing on the second impedance calibration code Ncode<5:0> every time a pulse of the second counting clock signal nclk is detected when the second indication signal is in a fourth level state, so as to achieve the calibration processing of the pull-down impedance.

It is to be noted that, the second pull-up resistor unit 202 and the first pull-up resistor unit 201 may be regarded as having the same structure, and their resistance values have the same change. Therefore, after the pull-up impedance calibration is completed, the calibrated first impedance calibration code Pcode<5:0> may also calibrate the second pull-up resistor unit 202 to the standard resistance value.

That is, during the process of impedance calibration, firstly, the first pull-up resistor unit 201 and the standard resistor 204 are used to form a path, and the size of the resistance value of the first pull-up resistor unit 201 is determined according to the voltage division between the first pull-up resistor unit 201 and the standard resistor, so as to adjust the first impedance calibration code Pcode<5:0> until the resistance value of the first pull-up resistor unit 201 is the standard resistance value. Then, after the pull-up impedance calibration is completed, the second pull-up resistor unit 202 and the pull-down resistor unit 203 are used to form a path, at this time, the second pull-up resistor unit 202 may be regarded as the standard resistor, and the size of the resistance value of the pull-down resistor unit 203 is determined according to the voltage division between the second pull-up resistor unit 202 and the pull-down resistor unit 203, so as to adjust the second impedance calibration code Ncode<5:0> until the resistance value of the pull-down resistor unit 203 is the standard resistance value.

Here, the second pull-up resistor unit 202 and the first pull-up resistor unit 201 may receive the first impedance calibration code Pcode<5:0> at the same time. It is to be noted that, during the calibration process of the pull-up impedance, since the pull-down resistor unit 203 is disconnected, although the second pull-up resistor unit 202 is controlled by the first impedance calibration code Pcode<5:0>, it is actually disconnected with the ground to avoid the problem of power consumption. In addition, the second pull-up resistor unit 202 and the first pull-up resistor unit 201 may not receive the first impedance calibration code Pcode<5:0> at the same time, that is, after the pull-up impedance calibration is completed, the first impedance calibration code Pcode<5:0> is sent to the second pull-up resistor unit 202.

In addition, similar to the calibration of the pull-up impedance, during the calibration process of the pull-down impedance, the specific relationship (i.e. the positive proportional relationship or the negative proportional relationship) between the second voltage signal and the resistance value of the pull-down resistor unit also depends on the actual application scenario. The second voltage signal may indicate the difference between the pull-down resistor and the standard resistance value, thereby determining the adjustment direction of the second impedance calibration code Ncode<5:0>, and forming a feedback adjustment loop. Similarly, as long as a self-consistent circuit adjustment logic is met, the control details of the pull-down impedance may be determined in various flexible ways.

The following provides a feasible control detail: the larger the second impedance calibration code Ncode<5:0>, the smaller the resistance value of the pull-down resistor unit 203, and the lower the second voltage signal. The third level state is the low level state, and the fourth level state is the high level state. At this time, in a case where the resistance value of the pull-down resistor unit 203 is smaller than the standard resistance, the voltage of the second voltage signal is smaller than the second reference voltage, and the second indication signal is in the high level state, so that subtraction processing is performed on the second impedance calibration code Ncode<5:0>, and the resistance value of the pull-down resistor unit 203 increases. On the contrary, in a case where the resistance value of the pull-down resistor unit 203 is greater than the standard resistance, the voltage of the second voltage signal is greater than the second reference voltage, and the second indication signal is in the low level state, so that addition processing is performed on the second impedance calibration code Ncode<5:0>, and the resistance value of the pull-down resistor unit 203 is reduced.

In a specific embodiment, as illustrated in FIG. 2, the control terminal of the first pull-up resistor unit 201 receives the first impedance calibration code Pcode<5:0>, the first terminal of the first pull-up resistor unit 201 is connected with a power signal, the second terminal of the first pull-up resistor unit 201 is connected with the first terminal of the standard resistor 204, and the second terminal of the standard resistor 204 is connected with a ground signal.

The control terminal of the second pull-up resistor unit 202 receives the first impedance calibration code Pcode<5:0>, the first terminal of the second pull-up resistor unit 202 is connected with the power signal, the second terminal of the second pull-up resistor unit 202 is connected with the first terminal of the pull-down resistor unit 203, and the second terminal of the pull-down resistor unit 203 is connected with the ground signal.

In this way, since the standard resistor 204 is connected with the first pull-up resistor unit 201 in series, and the first pull-up resistor unit 201 is closer to the power end, if the resistance value of the first pull-up resistor unit 201 is larger, the voltage division of the first pull-up resistor unit 201 is larger, and thus the level value of the first voltage signal is lower. Similarly, when the pull-down resistor is calibrated, it may be considered that the resistance value of the second pull-up resistor unit 202 is the standard resistance value, that is, the standard resistor is connected with the pull-down resistor unit 203 in series, and the standard resistor is closer to the power end. At this time, if the resistance value of the pull-down resistor unit 203 increases, the voltage division of the pull-down resistor unit 203 is larger, so that the level value of the second voltage signal is higher.

In this way, through the above closed-loop calibration logic, the adjustment of the first impedance calibration code Pcode<5:0> and the second impedance calibration code Ncode<5:0> may be realized, and the impedance calibration processing of the memory is completed. Meanwhile, since the first impedance calibration code Pcode<5:0> is adjusted from the first initial calibration value adapted to the current environment, and the second impedance calibration code Ncode<5:0> is adjusted from the second initial calibration value adapted to the current environment, which are closer to the calibration result, the speed of impedance calibration is faster, the power consumption and system time are saved, and the performance of the memory is improved.

In some embodiments, the calibration module 13 further includes an oscillation module 136 and a control module 137. The first counting module 131 is integrated with a first detection module, and the second counting module 134 is integrated with a second detection module.

The oscillation module 136 is configured to receive the calibration instruction signal ZQ start, and output a clock signal clk0 based on the calibration instruction signal ZQ start.

The control module 137 is configured to receive the clock signal clk0, and output the first counting clock signal pclk to the first counting module 131 based on the clock signal clk0.

The first detection module is configured to record the change of the first indication signal; and output a first stop signal Internal stop-1 to the control module 137 if the change of the first indication signal meets a first preset condition.

The control module 137 is further configured to stop output of the first counting clock signal pclk in a case where the first stop signal Internal stop-1 is received; and output the second counting clock signal nclk to the second counting module based on the clock signal clk0.

The second detection module is configured to record the change of the second indication signal; and output a second stop signal Internal stop-2 to the control module 137 if the change of the first indication signal meets a second preset condition.

The control module 137 is further configured to stop output of the second counting clock signal nclk in a case where the second stop signal Internal stop-2 is received.

In this way, the oscillation module 136 and the control module 137 may determine the first counting clock signal pclk and the second counting clock signal nclk, which are taken as counting clocks for the impedance calibration processing.

Exemplarily, the first preset condition refers to that the first indication signal continues to be changed from a second value to a first value after having been changed from the first value to the second value during three consecutive adjustment processes of the first impedance calibration code Pcode<5:0>. The second preset condition refers to that the second indication signal continues to be changed from the second value to the first value after having been changed from the first value to the second value during three consecutive adjustment processes of the second impedance calibration code Ncode<5:0>. Here, the first value is different from the second value.

Taking the first value of 1 and the second value of 0 as an example, during the adjustment process of the first impedance calibration code Pcode<5:0>, if the first indicator signal has a waveform change of 101, it means that the critical point where the first voltage signal is the same as the first reference signal is found, and it may be considered that the first impedance calibration code Pcode<5:0> has been calibrated to the standard resistance value, thereby stopping output of the first counting clock signal pclk, and the first impedance calibration code Pcode<5:0> no longer changes. Similarly, during the adjustment process of the second impedance calibration code Ncode<5:0>, if the second indication signal has a waveform change of 101, it may be considered that the pull-down impedance has been calibrated to the standard resistance value, thereby stopping output of the second counting clock signal pclk, and the second impedance calibration code Ncode<5:0> no longer changes.

In some embodiments, the control module 137 is further configured to output an internal stop signal Internal stop to the oscillation module 136 in a case where the second stop signal Internal stop-2 is received.

The oscillation module 136 is further configured to receive the internal stop signal Internal stop, and stop output of the clock signal clk0 based on the internal stop signal Internal stop.

In this way, after the calibration of the pull-down impedance ends, the clock signal clk0 is no longer needed, so that the oscillation module 136 is controlled to stop working through the internal stop signal Internal stop.

In some embodiments, the first counting module 131 is further configured to receive a latch signal ZQ latch, and latch the first impedance calibration code Pcode<5:0> based on the latch signal ZQ latch.

The second counting module 134 is further configured to receive the latch signal ZQ latch, and latch the second impedance calibration code Ncode<5:0> based on the latch signal ZQ latch.

Figure 3:
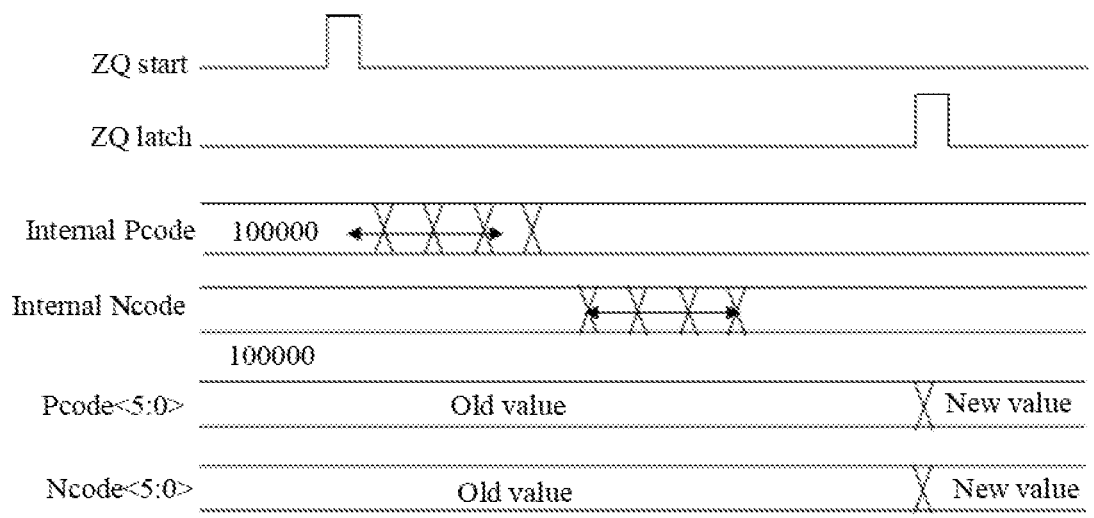
FIG. 3 is a schematic diagram of a signal timing of an impedance calibration according to an embodiment of the present disclosure.

Here, the calibration instruction signal ZQ start and the latch signal ZQ latch are both received from the outside (the system below). Referring to FIG. 3, FIG. 3 illustrates a schematic diagram of a signal timing of an impedance calibration. As illustrated in FIG. 3, after the system sends the calibration instruction signal ZQ start, the calibration control circuit 10 generates the initial value Internal Pcode (which is fixed to 100000 in the related art, and is the first initial calibration value adapted to the current environment in the embodiment of the present disclosure) of the first impedance calibration code, and adjusts from the initial value of the first impedance calibration code until the calibration of the pull-up impedance is completed; generates the initial value Internal ncode (which is fixed to 100000 in the related art, and is the second initial calibration value adapted to the current environment in the embodiment of the present disclosure) of the second impedance calibration code after the calibration of the pull-up impedance is completed, and adjusts from the initial value of the second impedance calibration code until the calibration of the pull-down impedance is completed; and finally latches the first impedance calibration code Pcode<5:0> and the second impedance calibration code Ncode<5:0> after the latch signal ZQ latch sent by the system is received.

Generally speaking, after the system sends the calibration instruction signal ZQ start, the latch signal ZQ latch may only be sent after the calibration is completed. However, the calibration time may not exceed a certain standard value according to the design requirements. That is, if the impedance calibration takes a long time, the calibration control circuit 10 may not be able to complete the calibration within the standard time, resulting in calibration failure and affecting the performance of the memory. In the embodiment of the present disclosure, both the first impedance calibration code Pcode<5:0> and the second impedance calibration code Ncode<5:0> are adjusted from the initial values adapted to the current environment, and the calibration takes less time. Therefore, more time margin may be provided for the latching process.

Figure 4:
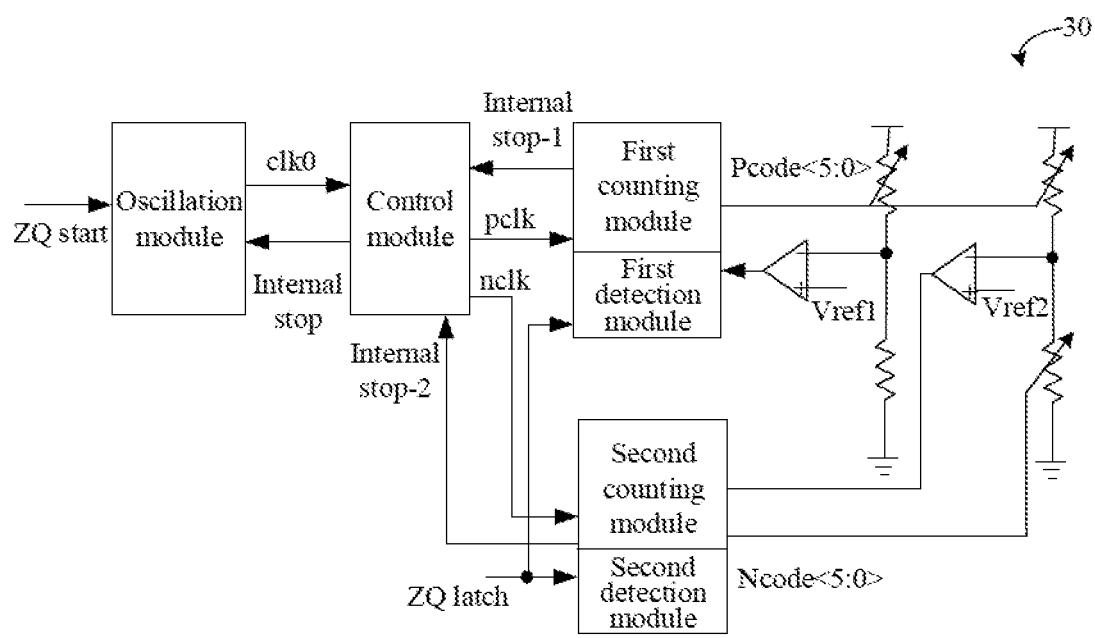
FIG. 4 is a schematic diagram of a structure of an impedance calibration circuit according to the related art.

Referring to FIG. 4, FIG. 4 is a schematic diagram of a structure of an impedance calibration circuit 30 according to the related art. As illustrated in FIG. 4, the impedance calibration circuit 30 may include a first counting module, a first comparator, a second counting module, a second comparator, a plurality of resistors, an oscillation module and a control module. In the related art, when ZQ calibration starts, the first impedance calibration code Pcode<5:0>=100000, the second impedance calibration code Ncode<5:0>=100000, that is, the first impedance calibration code and the second impedance calibration code change from the fixed initial values until the ideal impedance calibration effect is achieved. Correspondingly, the embodiments of the present disclosure provide an impedance calibration circuit 10 with a brand new architecture. When ZQ calibration (i.e. the aforementioned impedance calibration) starts, a corresponding initial calibration value is generated based on actual temperature conditions, so that the impedance calibration code loaded with the initial calibration value is used as the starting point for the entire ZQ calibration process. On the premise of ensuring the function and performance of the ZQ calibration, the ZQ calibration time is reduced, and at the same time, a sufficient time margin is provided for the latching of the impedance calibration code.

Figure 5:
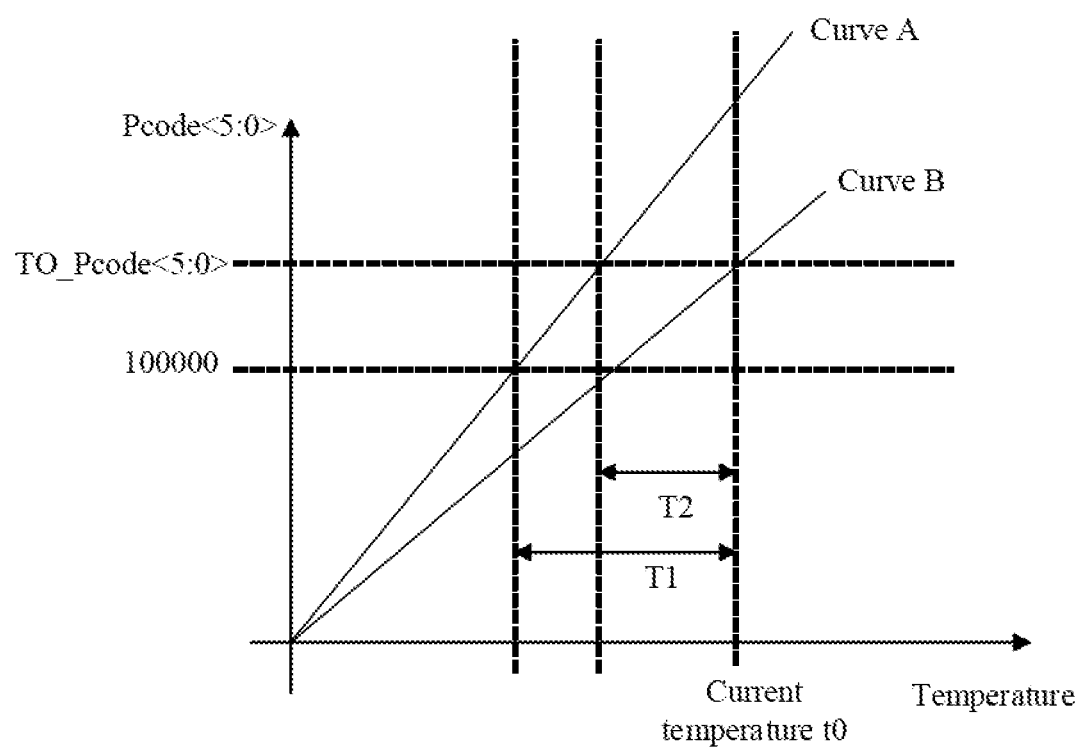
FIG. 5 is a schematic effect diagram of an impedance calibration circuit according to an embodiment of the present disclosure.

Specifically, referring to FIG. 5. FIG. 5 illustrates a schematic effect diagram of an impedance calibration circuit according to an embodiment of the present disclosure. In FIG. 5, a horizontal axis (X axis) refers to the temperature of the memory, a vertical axis (Y axis) refers to the value of the impedance calibration code (taking the first impedance calibration code Pcode<5:0> as an example), a curve A refers to the change of the first impedance calibration code with temperature, and a curve B refers to the change of the first initial calibration value with temperature. As illustrated in FIG. 5, assuming that the current temperature of the memory is t0 when the calibration instruction signal arrives, the impedance calibration circuit 30 in the related art needs to adjust from Pcode<5:0>=10000 to a target value ZQ_Pcode, and the consumed time is T1. The impedance calibration circuit 10 in the embodiment of the present disclosure only needs to adjust from Pcode<5:0>=TO_Pcode<5:0> to the target value ZQ_Pcode, and the consumed time is T2. Therefore, the impedance calibration process of the impedance calibration circuit 10 in the embodiment of the present disclosure takes less time and lower power consumption.

In summary, the embodiments of the present disclosure provide the impedance calibration circuit, which may generate the initial calibration value adapted to the current working environment, and use the initial calibration value as the starting point of the entire calibration process, thereby reducing the power consumption and time of impedance calibration, providing a better time margin for the latching of the calibration result, and improving the performance of the memory.

Figure 6:
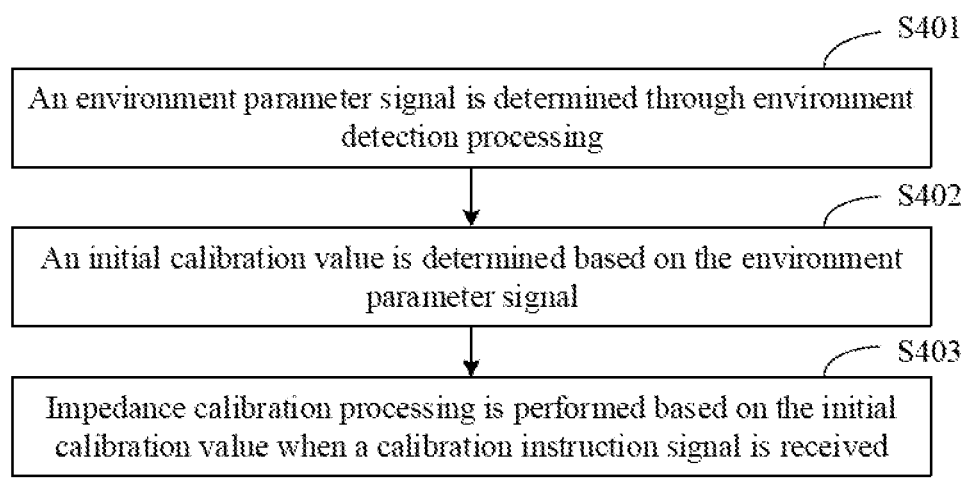
FIG. 6 is a schematic flowchart of an impedance calibration method according to an embodiment of the present disclosure.

In another embodiment of the present disclosure, referring to FIG. 6, FIG. 6 illustrates a schematic flowchart of an impedance calibration method according to an embodiment of the present disclosure. As illustrated in FIG. 6, the method may include the following operations.

At S401, an environment parameter signal is determined through environment detection processing.

At S402, an initial calibration value is determined based on the environment parameter signal.

At S403, impedance calibration processing is performed based on the initial calibration value when a calibration instruction signal is received.

It is to be noted that, the impedance calibration method provided by the embodiments of the present disclosure is applied to the aforementioned impedance calibration circuit 10. In this way, in the impedance calibration method provided by the embodiments of the present disclosure, the initial calibration value adapted to the current working environment is used as the starting point of the entire calibration process, so that the power consumption and time of impedance calibration are reduced, and the performance of the memory is improved.

In some embodiments, the environment parameter signal includes at least a temperature parameter signal. The operation that the environment parameter signal is determined through environment detection processing includes the following operations.

Temperature detection is performed on the environment where the impedance calibration circuit is located to obtain a temperature signal. Decoding processing is performed on the temperature signal to obtain the temperature parameter signal.

In some embodiments, the initial calibration value includes a first initial calibration value and a second initial calibration value. The operation that impedance calibration processing is performed based on the initial calibration value may include the following operations.

The first initial calibration value is determined as an initial value of a first impedance calibration code, and the second initial calibration value is determined as an initial value of a second impedance calibration code. The first impedance calibration code is adjusted to realize the calibration of pull-up impedance. The second impedance calibration code is adjusted after the pull-up impedance calibration is completed to realize the calibration of pull-down impedance.

In some embodiments, the impedance calibration circuit includes a first pull-up resistor unit connected with a standard resistor. Correspondingly, the operation that the first impedance calibration code is adjusted to realize the calibration of pull-up impedance may include the following operations.

The resistance value of the first pull-up resistor unit is adjusted based on the first impedance calibration code to determine a first voltage signal. The first voltage signal is compared with a first reference signal to output a first indication signal. Addition processing is performed on the first impedance calibration code every time a pulse of the first counting clock signal is detected when the first indication signal is in a first level state. Subtraction processing is performed on the first impedance calibration code every time a pulse of the first counting clock signal is detected when the first indication signal is in a second level state. Output of the first counting clock signal is stopped in a case where the change of the first indication signal meets a first preset condition, and the calibration process of the pull-up impedance ends.

In some embodiments, the impedance calibration circuit further includes a second pull-up resistor unit and a pull-down resistor unit. The resistance value of the second pull-up resistor unit is controlled by the first impedance calibration code, and the second pull-up resistor unit is connected with the pull-down resistor unit. Correspondingly, the operation that the second impedance calibration code is adjusted to realize the calibration of pull-down impedance may include the following operations.

The resistance value of the pull-down resistor unit is adjusted based on the second impedance calibration code to output a second voltage signal. Herein, after the pull-up impedance calibration is completed, the resistance value of the second pull-up resistor unit is calibrated to a standard resistance value by the first impedance calibration code. The second voltage signal is compared with a second reference signal to output a second indication signal. Addition processing is performed on the second impedance calibration code every time a pulse of the second counting clock signal is detected when the second indication signal is in a third level state. Subtraction processing is performed on the second impedance calibration code every time a pulse of the second counting clock signal is detected when the second indication signal is in a fourth level state. Output of the second counting clock signal is stopped in a case where the change of the second indication signal meets a second preset condition, and the calibration process of the pull-down impedance ends.

In some embodiments, the method further includes that: the first impedance calibration code and the second impedance calibration code are latched when a latch signal is received.

In this way, through the above closed-loop calibration logic, the adjustment of the first impedance calibration code and the second impedance calibration code may be realized, and the impedance calibration processing of the memory is completed. At the same time, since the first impedance calibration code is adjusted from the first initial calibration value applied to the current environment, and the second impedance calibration code is adjusted from the second initial calibration value applied to the current environment, the speed of impedance calibration is faster, the power consumption and system time are saved, and the performance of the memory is improved.

The embodiments of the present disclosure provide the impedance calibration method, which may generate the initial calibration value adapted to the current working environment, and use the initial calibration value as the starting point of the entire calibration process, thereby reducing the power consumption and time of impedance calibration, providing a better time margin for the latching of the calibration result, and improving the performance of the memory.

Figure 7:
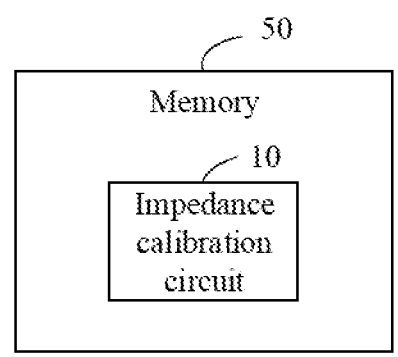
FIG. 7 is a schematic diagram of a structure of a memory according to an embodiment of the present disclosure.

In another embodiment of the present disclosure, referring to FIG. 7, FIG. 7 illustrates a schematic diagram of a structural composition of a memory 50 according to an embodiment of the present disclosure. As illustrated in FIG. 7, the memory 50 includes the aforementioned impedance calibration circuit 10.

The memory 50 includes the aforementioned impedance calibration circuit 10, which may generate the initial calibration value adapted to the current working environment, and use the initial calibration value as the starting point of the entire calibration process, thereby reducing the power consumption and time of impedance calibration, providing a better time margin for the latching of the calibration result, and improving the performance of the memory.

The above are only the preferred embodiments of the present disclosure, and are not intended to limit the scope of protection of the present disclosure. It is to be noted that in this disclosure, the terms "including", "containing" or any other variation thereof are intended to cover non-exclusive inclusion, so that a process, method, article or device including a series of elements includes not only those elements, but also other elements not explicitly listed, or elements inherent to the process, method, article or device. Without more restrictions, an element defined by the sentence "including a . . . " does not exclude the existence of other identical elements in the process, method, article, or device including the element. The above numbers of the embodiments of the present disclosure are only for description, and do not represent the advantages or disadvantages of the embodiments. The methods disclosed in the several method embodiments provided in the present disclosure may be combined arbitrarily without conflict to obtain new method embodiments. The features disclosed in the several product embodiments provided in the present disclosure may be combined arbitrarily without conflict to obtain new product embodiment. The features disclosed in several method or device embodiments provided in the present disclosure may be combined arbitrarily without conflict to obtain new method embodiments or device embodiments. The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure. Therefore, the scope of protection of the present disclosure shall be subject to the scope of protection of the claims.

INDUSTRIAL APPLICABILITY

The embodiments of the present disclosure provide an impedance calibration circuit, an impedance calibration method, and a memory. The impedance calibration circuit includes a parameter module, an initial value generation module, and a calibration module. Herein, the parameter module is configured to perform environment detection processing and output an environment parameter signal. The initial value generation module is configured to receive the environment parameter signal, and output an initial calibration value based on the environment parameter signal when the calibration instruction signal is received. The calibration module is configured to receive the initial calibration value, and perform impedance calibration processing based on the initial calibration value when the calibration instruction signal is received. In this way, the impedance calibration processing is performed by using the initial calibration value adapted to the current working environment, which may reduce the power consumption and time of the impedance calibration and improve the performance of the memory.

What is claimed is:

1. An impedance calibration circuit, comprising a parameter module, an initial value generation module, and a calibration module; wherein
the parameter module is configured to perform an environment detection processing and output an environment parameter signal;
the initial value generation module is configured to receive the environment parameter signal, and output an initial calibration value based on the environment parameter signal when a calibration instruction signal is received; and
the calibration module is configured to receive the initial calibration value, and perform impedance calibration processing based on the initial calibration value when the calibration instruction signal is received;
wherein the initial calibration value comprises a first initial calibration value and a second initial calibration value;
wherein the calibration module is further configured to:
determine the first initial calibration value as an initial value of a first impedance calibration code, and determine the second initial calibration value as an initial value of a second impedance calibration code; and
adjust the first impedance calibration code to realize a calibration of pull-up impedance; and adjust the second impedance calibration code after the pull-up impedance calibration is completed, to realize a calibration of pull-down impedance.

2. The impedance calibration circuit of claim 1, wherein the environment parameter signal comprises at least a temperature parameter signal, the parameter module comprises a temperature sensor and a decoding module; wherein
the temperature sensor is configured to perform temperature detection on the environment where the impedance calibration circuit is located, and output a temperature signal; and
the decoding module is configured to receive the temperature signal, perform decoding processing on the temperature signal, and output the temperature parameter signal.

3. The impedance calibration circuit of claim 1, wherein the calibration module comprises a first counting module, a first comparator, and a resistor module, the resistor module comprising a first pull-up resistor unit connected with a standard resistor; wherein
the resistor module is configured to receive the first impedance calibration code, control a resistance value of the first pull-up resistor unit based on the first impedance calibration code, and output a first voltage signal;
the first comparator is configured to receive the first voltage signal and a first reference signal, compare the first voltage signal with the first reference signal, and output a first indication signal; and
the first counting module is configured to receive the first indication signal and a first counting clock signal, and perform addition processing on the first impedance calibration code every time a pulse of the first counting clock signal is detected when the first indication signal is in a first level state; and perform subtraction processing on the first impedance calibration code every time a pulse of the first counting clock signal is detected when the first indication signal is in a second level state, to achieve calibration processing of the pull-up impedance.

4. The impedance calibration circuit of claim 3, wherein the calibration module further comprises a second counting module and a second comparator, the resistor module further comprises a second pull-up resistor unit and a pull-down resistor unit, a resistance value of the second pull-up resistor unit is controlled by the first impedance calibration code, and the second pull-up resistor unit is connected with the pull-down resistor unit; wherein
the resistor module is further configured to control a resistance value of the pull-down resistor unit based on the second impedance calibration code after the pull-up impedance calibration is completed, and output a second voltage signal; wherein after the pull-up impedance calibration is completed, a resistance value of the second pull-up resistor unit is calibrated to a standard resistance value by the first impedance calibration code;
the second comparator is configured to receive the second voltage signal and a second reference signal, compare the second voltage signal with the second reference signal, and output a second indication signal; and the second counting module is configured to receive the second indication signal and a second counting clock signal, and perform addition processing on the second impedance calibration code every time a pulse of the second counting clock signal is detected when the second indication signal is in a third level state; and perform subtraction processing on the second impedance calibration code every time a pulse of the second counting clock signal is detected when the second indication signal is in a fourth level state, to achieve calibration processing of the pull-down impedance.

5. The impedance calibration circuit of claim 4, wherein a control terminal of the first pull-up resistor unit receives the first impedance calibration code, a first terminal of the first pull-up resistor unit is connected with a power signal, a second terminal of the first pull-up resistor unit is connected with a first terminal of the standard resistor, and a second terminal of the standard resistor is connected with a ground signal; and
   a control terminal of the second pull-up resistor unit receives the first impedance calibration code, a first terminal of the second pull-up resistor unit is connected with the power signal, a second terminal of the second pull-up resistor unit is connected with a first terminal of the pull-down resistor unit, and a second terminal of the pull-down resistor unit is connected with the ground signal.

6. The impedance calibration circuit of claim 4, wherein the calibration module further comprises an oscillation module and a control module, the first counting module is integrated with a first detection module, and the second counting module is integrated with a second detection module; wherein
   the oscillation module is configured to receive the calibration instruction signal, and output a clock signal based on the calibration instruction signal;
   the control module is configured to receive the clock signal, and output the first counting clock signal to the first counting module based on the clock signal;
   the first detection module is configured to record a change of the first indication signal; and output a first stop signal to the control module responsive to that the change of the first indication signal meets a first preset condition;
   the control module is further configured to stop output of the first counting clock signal in a case where the first stop signal is received, and output the second counting clock signal to the second counting module based on the clock signal;
   the second detection module is configured to record a change of the second indication signal; and output a second stop signal to the control module responsive to that the change of the first indication signal meets a second preset condition; and
   the control module is further configured to stop output of the second counting clock signal in a case where the second stop signal is received.

7. The impedance calibration circuit of claim 6, wherein the control module is further configured to output an internal stop signal to the oscillation module in a case where the second stop signal is received; and
   the oscillation module is further configured to receive the internal stop signal, and stop output of the clock signal based on the internal stop signal.

8. The impedance calibration circuit of claim 6, wherein the first preset condition refers to that the first indication signal continues to be changed from a second value to a first value after having been changed from the first value to the second value during three consecutive adjustment processes of the first impedance calibration code; and
   the second preset condition refers to that the second indication signal continues to be changed from the second value to the first value after having been changed from the first value to the second value during three consecutive adjustment processes of the second impedance calibration code.

9. The impedance calibration circuit of claim 4, wherein the first counting module is further configured to receive a latch signal, and latch the first impedance calibration code based on the latch signal; and
   the second counting module is further configured to receive the latch signal, and latch the second impedance calibration code based on the latch signal.

10. An impedance calibration method, applied to the impedance calibration circuit of claim 1, comprising:
    determining an environment parameter signal through environment detection processing, performed by the parameter module;
    determining an initial calibration value based on the environment parameter signal when a calibration instruction signal is received, performed by the initial value generation module; and
    performing impedance calibration processing based on the initial calibration value when the calibration instruction signal is received, performed by the calibration module;
    wherein the initial calibration value comprises a first initial calibration value and a second initial calibration value, and performing impedance calibration processing based on the initial calibration value comprises:
    determining the first initial calibration value as an initial value of a first impedance calibration code, and determining the second initial calibration value as an initial value of a second impedance calibration code;
    adjusting the first impedance calibration code to realize a calibration of pull-up impedance; and
    adjusting the second impedance calibration code after the pull-up impedance calibration is completed, to realize a calibration of pull-down impedance.

11. The impedance calibration method of claim 10, wherein the environment parameter signal comprises at least a temperature parameter signal, and determining the environment parameter signal through environment detection processing comprises:
    performing temperature detection on the environment where the impedance calibration circuit is located to obtain a temperature signal; and
    performing decoding processing on the temperature signal to obtain the temperature parameter signal.

12. The impedance calibration method of claim 10, wherein the impedance calibration circuit comprises a first pull-up resistor unit connected with a standard resistor, and adjusting the first impedance calibration code to realize the calibration of the pull-up impedance comprises:
    adjusting a resistance value of the first pull-up resistor unit based on the first impedance calibration code to determine a first voltage signal;
    comparing the first voltage signal with a first reference signal to output a first indication signal;

performing addition processing on the first impedance calibration code every time a pulse of the first counting clock signal is detected when the first indication signal is in a first level state; and performing subtraction processing on the first impedance calibration code every time a pulse of the first counting clock signal is detected when the first indication signal is in a second level state; and stopping output of the first counting clock signal in a case where a change of the first indication signal meets a first preset condition, and ending calibration process of the pull-up impedance.

13. The impedance calibration method of claim 10, wherein the impedance calibration circuit further comprises a second pull-up resistor unit and a pull-down resistor unit, wherein the resistance value of the second pull-up resistor unit is controlled by the first impedance calibration code, and the second pull-up resistor unit is connected with the pull-down resistor unit; and adjusting the second impedance calibration code to realize the calibration of the pull-down impedance comprises:

adjusting a resistance value of the pull-down resistor unit based on the second impedance calibration code to output a second voltage signal, wherein, after the pull-up impedance calibration is completed, a resistance value of the second pull-up resistor unit is calibrated to a standard resistance value by the first impedance calibration code;

comparing the second voltage signal with a second reference signal to output a second indication signal;

performing addition processing on the second impedance calibration code every time a pulse of the second counting clock signal is detected when the second indication signal is in a third level state; and performing subtraction processing on the second impedance calibration code every time a pulse of the second counting clock signal is detected when the second indication signal is in a fourth level state; and stopping output of the second counting clock signal in a case where a change of the second indication signal meets a second preset condition, and ending calibration process of the pull-down impedance.

14. The impedance calibration method of claim 10, further comprising:

latching the first impedance calibration code and the second impedance calibration code when a latch signal is received.

15. A semiconductor memory, comprising the impedance calibration circuit, wherein the impedance calibration circuit comprises a parameter module, an initial value generation module, and a calibration module;

the parameter module is configured to perform an environment detection processing and output an environment parameter signal;

the initial value generation module is configured to receive the environment parameter signal, and output an initial calibration value based on the environment parameter signal when a calibration instruction signal is received; and the calibration module is configured to receive the initial calibration value, and perform impedance calibration processing based on the initial calibration value when the calibration instruction signal is received;

wherein the initial calibration value comprises a first initial calibration value and a second initial calibration value;

wherein the calibration module is specifically configured to: determine the first initial calibration value as an initial value of a first impedance calibration code, and determine the second initial calibration value as an initial value of a second impedance calibration code; and adjust the first impedance calibration code to realize a calibration of pull-up impedance; and adjust the second impedance calibration code after the pull-up impedance calibration is completed, to realize a calibration of pull-down impedance.

16. The semiconductor memory of claim 15, wherein the environment parameter signal comprises at least a temperature parameter signal, the parameter module comprises a temperature sensor and a decoding module; wherein the temperature sensor is configured to perform temperature detection on the environment where the impedance calibration circuit is located, and output a temperature signal; and the decoding module is configured to receive the temperature signal, perform decoding processing on the temperature signal, and output the temperature parameter signal.

17. The semiconductor memory of claim 15, wherein the calibration module comprises a first counting module, a first comparator, and a resistor module, the resistor module comprising a first pull-up resistor unit connected with a standard resistor; wherein the resistor module is configured to receive the first impedance calibration code, control a resistance value of the first pull-up resistor unit based on the first impedance calibration code, and output a first voltage signal;

the first comparator is configured to receive the first voltage signal and a first reference signal, compare the first voltage signal with the first reference signal, and output a first indication signal; and the first counting module is configured to receive the first indication signal and a first counting clock signal, and perform addition processing on the first impedance calibration code every time a pulse of the first counting clock signal is detected when the first indication signal is in a first level state; and perform subtraction processing on the first impedance calibration code every time a pulse of the first counting clock signal is detected when the first indication signal is in a second level state, to achieve calibration processing of the pull-up impedance.

* * * * *